(12) United States Patent  
Pricer et al.

(10) Patent No.: US 6,993,671 B2  
(45) Date of Patent: Jan. 31, 2006

(54) HIGH SPEED CLOCK DIVIDER WITH SYNCHRONOUS PHASE START-UP OVER PHYSICALLY DISTRIBUTED SPACE

(75) Inventors: Douglas C. Pricer, Somerset, NJ (US); David R. Stauffer, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 332 days.

(21) Appl. No.: 10/249,291

(22) Filed: Mar. 28, 2003

(65) Prior Publication Data

US 2004/0193933 A1    Sep. 30, 2004

(51) Int. Cl.  
*G06F 1/12* (2006.01)

(52) U.S. Cl. ..................... 713/400; 713/401
(58) Field of Classification Search ............... 713/400, 713/401  
See application file for complete search history.

(56) References Cited

U.S. PATENT DOCUMENTS

| | | | |
|---|---|---|---|
| 4,949,249 A | 8/1990 | Lefsky et al. ............... | 364/200 |
| 5,467,464 A | 11/1995 | Oprescu et al. ............. | 395/550 |
| 5,628,000 A | 5/1997 | Kashiyama et al. ......... | 395/558 |
| 5,712,883 A * | 1/1998 | Miller et al. ................. | 375/371 |
| 5,717,729 A * | 2/1998 | Iknaian et al. .............. | 375/356 |
| 5,778,216 A | 7/1998 | Venkatesh ................... | 395/558 |
| 5,889,979 A | 3/1999 | Miller, Jr. et al. .......... | 395/558 |
| 6,055,248 A * | 4/2000 | Kobayashi ................... | 370/517 |
| 6,073,245 A | 6/2000 | Hirata et al. ................. | 713/400 |
| 6,223,328 B1 * | 4/2001 | Ito et al. ........................ | 716/6 |
| 6,473,440 B1 * | 10/2002 | Bae et al. .................... | 370/503 |

* cited by examiner

*Primary Examiner*—Chun Cao  
(74) *Attorney, Agent, or Firm*—Richard Kotulak, Esq.; Greenblum & Bernstein, P.L.C.

(57) ABSTRACT

A system and method that controls the start time of different clocks in different clock domains, each of which is controlling an I/O, provides that the first cycle of each time domain is within a predetermined timing delay of one another. Reset signals are pipelined across the clock domains such that all the clocks trigger at substantially the same time. The clock channels may be arranged logically and physically in n groups of m channels with delays associated with each n group according to the relative position of the n group within the sequence of the n groups.

20 Claims, 3 Drawing Sheets

HIGH SPEED CLOCK DIVIDER WITH SYNCHRONOUS PHASE START-UP OVER PHYSICALLY DISTRIBUTED SPACE

BACKGROUND OF THE INVENTION

1. Field of the Invention

The present invention generally relates to controlling clocks in a circuit and particularly distributed clocks so that the synchronization of the different clocks is within a predetermined timing delay of one another.

2. Background Description

A growing number of standards require use of High-Speed Serial Links (HSSL) to send large amounts of data between chips in a system (e.g., a computer-based control system, a communication system, or the like) while minimizing the number of chip i/o pins and circuit board connections. Some of these standards require sufficiently large bandwidth that multiple HSSL channels are required to implement the physical layer of the interface.

When using multiple HSSL channels, data at the transmission source is distributed between the multiple HSSL channels using an arbitrary ordering algorithm, and then must be reconstructed at the receiver. To create reasonable design limits on the receiver, and to ensure interoperability of the transmitter and receiver, constraints may be required on the transmitter regarding this distribution between channels. For example, if data is distributed between channels by bit striping (or other technique) across the available channels (i.e., bit 1 is transmitted on channel 1, bit 2 on channel 2, bit N on channel N, bit N+1 on channel 1, etc.), then the propagation delay of the various HSSL channels must be controlled such that the receiver can reliably demultiplex the data and reconstruct the original message content.

However, a complex problem arises when the propagation delay difference between the channels can exceed a bit time of the serial data. The receiver must employ a "deskew" algorithm to determine, and correct for, the difference in propagation delay between the HSSL channels. The deskew range is a design parameter which can have a significant effect on the complexity of the receiver design, and if insufficient, impacts interoperability of the system. The definition of the interface standard therefore may dictate a skew budget to various system components (i.e., the amount of propagation delay difference between channels that may be introduced by each system component). At the transmitter, this requires tight control of the skew between channels of the transmitted data.

The architecture of typical HSSL transmit macros is that each HSSL channel provides a W to 1 multiplexer function, where W-bit parallel data using a 1/W clock rate is multiplexed onto a high-speed serial channel that is 1-bit wide and runs at the full baud rate. Typically, the HSSL macro has a lower frequency clock input (perhaps, as an example, with a frequency of ¼ the baud rate), and contains a phase lock loop (PLL) which performs clock frequency multiplication. This provides a stable high frequency clock locally within the macro, and avoids the problems associated with distributing a high-speed clock over a large area within the chip. The PLL clock is then divided down within the macro to provide the 1/W clock rate to logic that drives the data input to the HSSL transmit macro.

But, in applications that require multiple HSSL channels, the HSSL channel architecture is duplicated for the number of channels required. Thus, an N channel implementation requires N independent HSSL channels, each of which has its own independent 1/W clock supplied to upstream logic. These 1/W clocks may be supplied from a common PLL or may be supplied from independent PLLs, depending on the architecture of the available HSSL macros. Because of the use of multiple parallel PLLs, and because of routing delay variance between channels, which applies even in cases when a common PLL is used, the N 1/W clocks will have significant phase variation. Additionally, this phase variation may drift over time as the chip undergoes changes in temperature or supply voltage.

The HSSL channel architecture described above (and specifically the necessity of having N independent 1/W clocks with individual phase variation) conflicts with the ability to tightly control the skew introduced between channels in the transmission system. A typical chip architecture will use a common clock domain to supply parallel data to the interface transmit logic associated with the HSSL macros. This data must be distributed between HSSL channels using an appropriate algorithm, and must be re-timed independently to each of the N independent 1/W channel clocks. This is typically done using one of several techniques to retime data across clock domains; an example technique being to use a FIFO which is written based on the chip's primary clock domain, and which is read based on the local channel 1/W clock. However, the skew requirements of the interface standard prevent the N channel clocks from being treated entirely independently. It is necessary to ensure that data being read out of the N FIFOs associated with each of the N HSSL channels starts in each of the N clock domains within a tolerance window. A one clock cycle slip in the startup of one FIFO relative to another FIFO would introduce W bits of skew into the transmit system, which likely exceeds the specified skew budget for the transmit component.

Synchronous start-up of N parallel FIFOs using N independent clocks requires a trivial logic implementation if N is sufficiently small such that the chip area over which the logic is implemented is very confined, or if the frequency of the 1/W clocks is sufficiently low relative to the propagation delay of the clock trees. However, if N is sufficiently large enough to force distribution of the FIFOs into physically separated areas, and if the clock tree propagation delay requires a significant portion of the cycle time for the 1/W clock, then the logical/physical implementation must consider achievable propagation delays given the necessary wire length and clock tree delays. In this case, achieving an implementation that meets both the skew requirements of the interface, and the chip timing requirements, is non-trivial. The present invention provides a solution to the above described problem.

SUMMARY OF THE INVENTION

In an aspect of the present invention, a device is provided for synchronizing n groups of m channels. The device includes a main divided clock used as a write clock for timing components and a retimer block propagating the main divided clock to groups of m channels. A pipeline block matches pipeline delay in clock startup that is created by propagation through the retimer block to produce separate divided clocks for each of the m channels. The separate divided clocks are phase aligned with the main divided clock and substantially synchronized.

In another aspect, a method is provided to synchronize clocks in n groups of m channels. The method includes dividing a main clock to provide a main divided clock used as a write clock for FIFOs and propagating the main divided clock to groups of m channels. The method further includes matching pipeline delay in clock startup created by propagation to produce separate divided clocks for each of the m channels. The separate divided clocks are phase aligned with the main divided clock and substantially synchronized.

In another aspect, the method includes dividing a main clock to provide a main divided clock used as a write clock for FIFOs and propagating the main divided clock to n channel groups of m channels. The method further includes matching pipeline delay in clock startup created by propagation through retimer blocks to produce separate divided clocks for each of the m channels. The separate divided clocks are phase aligned with the main divided clock and substantially synchronized. The start times of the separate divided clocks are controlled in different clock time domains so that the first cycle of each clock time domain is within a predetermined delay of one another.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A DETAILED EMBODIMENT OF THE INVENTION

Figure 1:
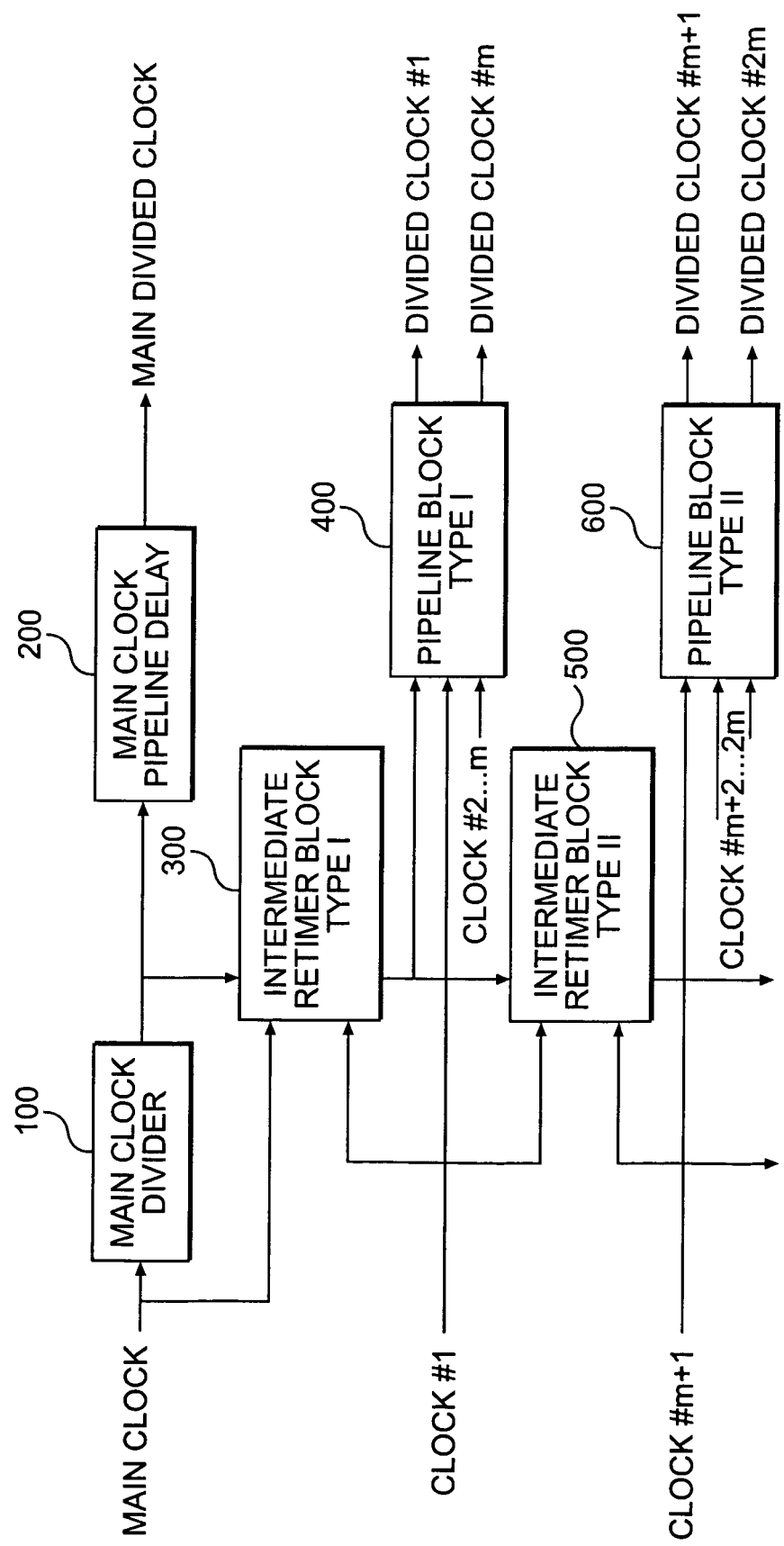
FIG. 1 is a block diagram showing the general organization of the present invention.

Referring now to FIG. 1, a block diagram of the present invention is shown. In this block diagram, illustrative of the present invention, serial channels are organized based on their physical locations into n groups of m channels. In aspects of the present invention, each group of m channels is assumed to be physically grouped. For instance, in the embodiment, each HSSL macro contains four channels, and therefore a total of N=16 channels are grouped into n=4 groups of m=4 channels. If, however, all channels are dispersed, then m can be 1. This example is provided for illustrative purposes and is not intended to limit the present invention to any one type or number of groups.

Still referring to FIG. 1, a main clock of the chip (frequency 1/W) is divided by a main clock divider 100 and delayed by a main clock pipeline delay block 200. This produces, in embodiments, a main divided clock (frequency 1/(2W)) which is used as the write clock for all N retiming FIFOs. The main clock pipeline delay block 200 matches the pipeline delay in clock startup that is created by propagation through intermediate retimer blocks 300, 500. The intermediate retimer blocks 300,500 propagate the main divided clock to each physical group of m channels. For each group of m channels, one of the channel clocks (e.g., clock #1, clock #m+1) is selected as being representative for the group, and is used by the intermediate retimer blocks 300, 500 in the propagation path immediately upstream and downstream of the group. Each intermediate retimer block 300, 500 retimes the main divided clock from the clock for the upstream group to the clock for the downstream group. The elements in the intermediate retimer blocks 300, 500 are distributed along the physical path between the groups. As will be discussed with reference to FIG. 2, two types of intermediate retimer blocks may be utilized by the present invention; namely, the first intermediate retimer block 300 is a Type I block and the second intermediate retimer block 500 is a Type II block. It should be understood that as this architecture is extended for n>2, Type I and Type II blocks may continue to be alternated.

Pipeline blocks 400,600 match the pipeline delay in clock startup that is created by propagation through the intermediate retimer blocks 300, 500. These blocks 400, 600 produce separate divided clocks for each of the m channels within the group. These separate divided clocks are, in embodiments, slaved to the main divided clock such that, after reset, all of these clocks will start pulsing and will be phase aligned within +/−¼ clock cycle of the start up of the main divided clock. These separate divided clocks are used as the read clocks for the corresponding retiming FIFOs. The amount of phase difference between the clock domains is dependent on the phase difference between the main clock and the corresponding channel clock. As discussed with reference to FIG. 2, there may be two types of pipeline blocks 400, 600 which differ slightly in circuit implementation. The first group of channels may use a Pipleline Type I block 400 and the second group may use a pipeline Type II block 600. As this architecture is extended for n>2, Type I and Type II blocks may continue to be alternated.

Figure 2:
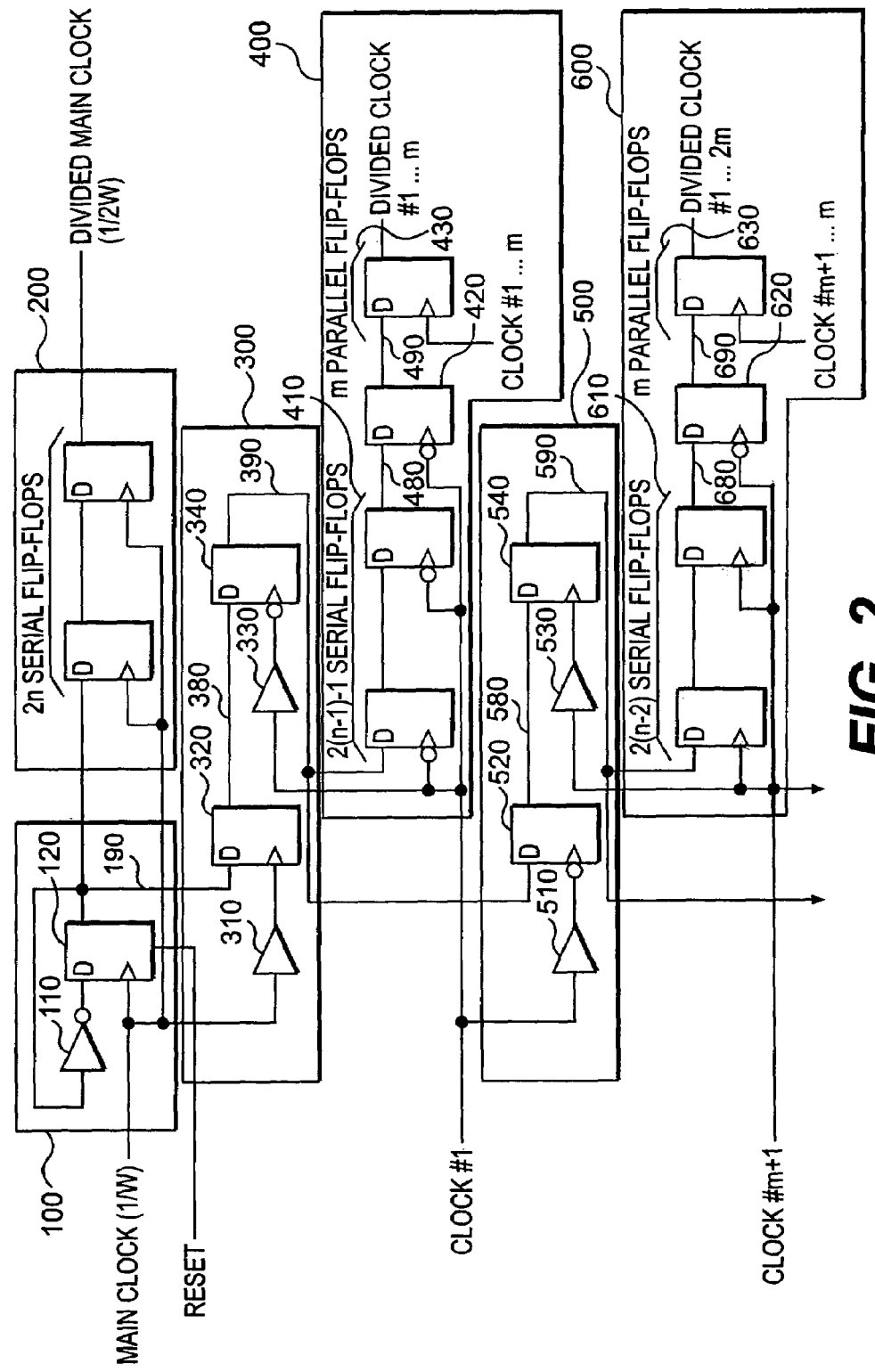
FIG. 2 is a circuit diagram of the present invention according to FIG. 1.

FIG. 2 shows a circuit diagram implementing the present invention. In general, the circuit includes D flip-flop circuit elements, either triggered by a positive or negative clock edge, buffers, and an inverter. The main clock divider 100 includes a flip-flop 120 and an inverter 110, which together form a divide by 2 circuit. The flip-flop output is held at '0' during assertion of the Reset input. Those of ordinary skill in the art should understand that by holding the Reset input for a sufficiently long time, this logic 0 level will propagate through the circuit. In aspects of the invention, all divided clocks and the divided main clock initiate clocking at approximately the same time (with a phase difference of less than +/−¼ cycle) after reset is deasserted (i.e. synchronous start-up).

FIG. 2 further shows the main clock pipeline delay circuit 200. In this circuit, a number of flip-flops are connected in series to generate a delay of several clock cycles. This delay compensates for the delay through the intermediate retimer blocks 300, 500 such that the synchronous start-up requirement is met. The number of flip-flops required is dependent on the number of groups of channels (n), and is, in embodiments, equal to 2n flip-flops. The intermediate retimer block 300 (Type I) includes positive edge-triggered flip-flop 320 and buffer 310 associated with a representative clock domain from the upstream group of channels (which is the main clock when block 300 is associated with the first group of channels), and negative edge triggered flip-flop 340 and buffer 330 associated with a representative clock from the downstream group of channels. The logic elements of block 300 are grouped relatively near each other and approximately midway between the locations of the upstream and downstream groups of channels. Because flip-flop 320 is relatively far from the upstream group of channels, the flip-flop triggering is selected to provide a full cycle path for timing. Likewise, flip-flop 340 triggering provides a full cycle path for timing to the downstream channel group. Buffers 310 and 330 provide optional delay to allow fine-tuning of the timing for these paths.

It should be appreciated that the path from flip-flop 320 to flip-flop 340 may have tight timing requirements. Because of possible phase differences between the clocks, signals should propagate along this path in substantially less than ½ a clock cycle. However, the actual requirements depend on the amount of phase mismatch that may be introduced by the HSSL macros. These flip-flops 320 and 340 should, in embodiments, be located in close proximity to each other. The intermediate retimer block 500 (Type II) is similar to the Type I block 300, except that the triggering phase of flip-flops 520 and 540 has been reversed. Thus, paths from the upstream blocks and to the downstream blocks remain full cycle timing paths.

In FIG. 2, the pipeline block 400 (Type I) is shown to include a number of flip-flops 410 connected in series to generate a delay of several clock cycles, an additional negative edge triggered flip-flop 420 and m parallel flip-flops 430 providing retiming to the individual clock domains within the group. The number of flip-flops required to perform pipeline delay 410 is dependent on the total number of channel groups (n), and the position of the particular channel group within the sequence of channel groups (i in the range 1 to n). For example, the number of flip-flops required is 2(n−i)−1 if i<n, or 0 if i=n. The block 400 is associated with the first channel group, and therefore 2(n−1)−1 flip-flops are typically provided. The timing path between flip-flop 420 and flip-flops 430 is substantially less than ½ a clock cycle, and therefore these flip-flops are located in close proximity to each other.

The pipeline block 600 (Type II) is similar to the Type I block 400 except for the number of flip-flops in the pipeline delay chain 610, and the triggering employed by these flip-flops. The number of flip-flops required is 2(n−i). The block 600 is associated with the second channel group and therefore 2(n−2) flip-flops are required for this illustrative example. The flip-flops 610 are positive edge triggered, while the corresponding flip-flops 410 are negative edge triggered.

Figure 3:
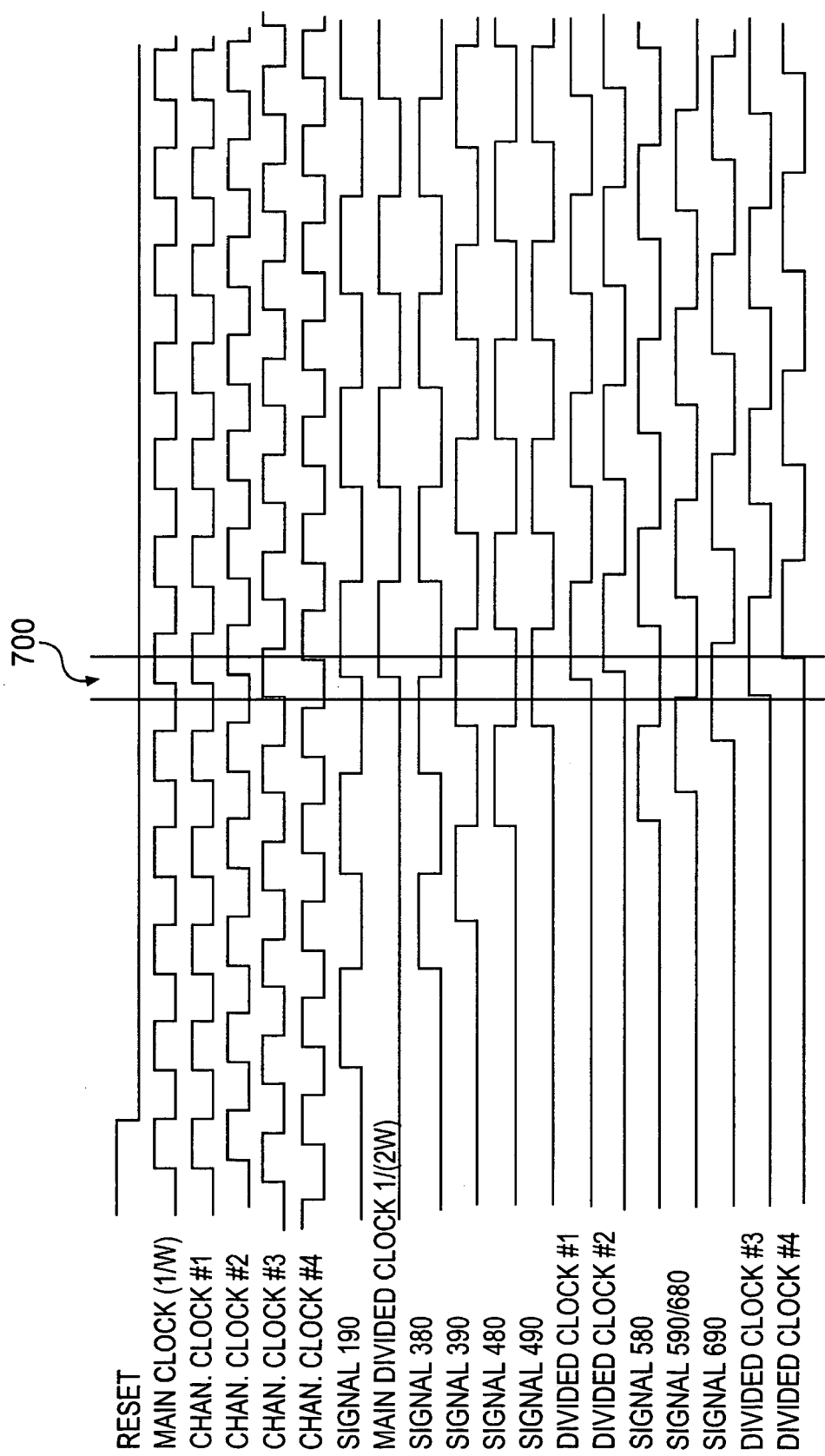
FIG. 3 is a timing diagram of the signals associated with FIG. 2.

FIG. 3 shows a timing diagram of an exemplary system having N=4 channels grouped into n=2 groups of m=2 channels each. Channel clock #1 and channel clock #2 are part of the first group of channels; whereas, in this illustrative example, channel clock #3 and channel clock #4 compose the second group of channels. The main clock and channel clocks #1 through #4 are shown with some phase variation relative to each other. As discussed previously, this phase variation may be due to routing delays and due to variation between parallel PLLs.

In FIG. 3, the signal 190 is the output of the main clock divider flip-flop 120, and starts toggling on the first cycle of the main clock following Reset. The main clock pipeline delay block introduces four (4) clock cycles of delay in this implementation, resulting in the main divided clock output shown. The signal 190 waveform is delayed by one clock cycle of the main clock by flip-flop 320, resulting in signal 380. Flip-flop 340 further delays this waveform until the next falling edge of channel clock #1, resulting in signal 390. Signal 390 then feeds both the first pipeline block 400, and the next downstream intermediate retiming block 500. The signal 390 waveform is delayed by one clock cycle of channel clock #1 by flip-flops 410. For this exemplary embodiment, 2(2−1)−1=1, so reference numeral 410 is representative of only one flip-flop. The resulting signal 480 is further delayed by one clock cycle of clock #1 by flip-flop 420 to produce signal 490. The signal 490 propagates to the inputs of two flip-flops 430 which provide retiming to the next rising edge of channel clock #1 and channel clock #2, respectively. The resulting divided clock #1 and divided clock#2 are shown in FIG. 3.

The signal 390 waveform also propagates to flip-flop 520, which delays the signal by one clock cycle of channel clock #1, resulting in the waveform shown for signal 580. The flip-flop 540 further delays this waveform until the next rising edge of clock #3 to produce signal 590. The signal 590 only propagates to the second pipeline block 600 since n=2 for this exemplary implementation. For n>2, it would also propagate to the next intermediate retiming block. Since n=2, there are zero flip-flops in delay chain 610, and signal 680 is equivalent to signal 590. This signal is further delayed by one clock cycle of channel clock #3 by flip-flop 620 to produce signal 690. The signal 690 propagates to the inputs of two flip-flops 630 which provide retiming to the next rising edge of channel clock #3 and channel clock #4 respectively. The resulting divided clock #3 and divided clock #4 are shown in FIG. 3.

Despite the distributed nature of the invention, it should be understood that the main divided clock and all of the divided clocks #1 through #4, all initiate toggling within the window 700. Each divided clock is in the clock domain of the corresponding channel clock, however, the circuit implementation of the present invention forces synchronization across the clock domains such that a synchronous start up is provided.

Illustrative Implementation of the Present Invention

The present invention may be applied to and meet the requirements of a wide range of standards and application situations. In an example, applications may require HSSL macros designed such that each channel produces its own channel clock. This type of implementation may create a requirement to retime data into separate clock domains for each bit of the interface. But in some implementations, phase skew limitations may be imposed requiring some control linkage across all the clock domains. In such cases where there are skew limitations, the approach requires redesign of the HSSL macro such that all N channels are incorporated into a single macro, with all channel clocks derived from the same PLL. However, this approach requires clock distribution over a relatively large area, with corresponding issues with wiring delays. The present invention provides a logical and physical implementation which divides each of N channel clocks with frequency of 1/W to supply N FIFO read clocks with frequency 1/(2W). Furthermore, assuming the 1/W clock phases are within a tolerance of +/−t, the divided clocks will start up in phase, and in the same cycle, within a corresponding tolerance of +/−t (i.e., substantially synchronized), where t is less than or equal to one quarter of the cycle time of the 1/W clocks.

To further illustrate the present invention, aspects of the present invention also may be used with ASIC Unilink High Speed Serializer transmit cores for interconnections between telecom framer chips and the serializer/deserializer chips. In one example, N=17, where one of the N clock domains is both a 17th channel clock and the main clock domain of the chip. The Unilink High Speed Serializer implementation dictates W=8. This interface typically requires the transmit skew be maintained to a value of 3.2 times the serial bit time, with drift maintained within 1.2 times the serial bit time. Therefore, t=3.2 times the serial bit time. In the embodiment of this invention, the serial bit time, or baud rate, is 400 ps. The corresponding frequency of the 1/W clocks is therefore approximately 311 MHz, and the clock distribution delay in SA27E 0.18 micron technology is therefore significant relative to the 3.2 ns period of these clocks. Furthermore, N=17 requires distribution of the FIFOs with worst case physical separation of over 5 mm, creating wiring delays that are significant relative to the 3.2 ns period of these clocks. The use of the present invention in this implementation solves such wiring delays and maintains a substantially synchronous timing between the channels.

While the invention has been described in terms of preferred embodiments, those skilled in the art will recognize that the invention can be practiced with modifications and in the spirit and scope of the appended claims.

What is claimed is:

1. A device for providing synchronized n groups of m channels, comprising:
   a main divided clock used as a write clock for timing components;
   a retimer block propagating the main divided clock to groups of m channels; and
   a pipeline block which matches pipeline delay in clock startup that is created by propagation through the retimer block to produce separate divided clocks for each of the m channels,
   wherein the separate divided clocks are phase aligned with the main divided clock and substantially synchronized.

2. The device of claim 1, wherein start times of the separate divided clocks in different clock domains are controlled so that a first cycle of each time domain is within a predetermined timing delay of one another.

3. The device of claim 1, wherein the groups of m channels are physical groups of m channels.

4. The device of claim 1, wherein the main divided clock comprises a main clock divider and a main clock pipeline delay.

5. The device of claim 4, wherein the main clock pipeline delay delays a main clock frequency.

6. The device of claim 5, wherein the main clock divider divides the main clock frequency.

7. The device of claim 1, wherein one clock within one of the groups of m channels is selected as being representative of an entire group of m channels and used by the retimer block in a propagation path immediately upstream or downstream of the groups of m channels in order to redivide the main divided clock.

8. The device of claim 1, wherein the separate divided clocks are used as read clocks by associated FIFOs.

9. The device of claim 1, wherein the retimer block is an intermediate retimer block of a first type and a second type such that when n>2, the first type and the second type alternate, and the pipeline block is n pipeline blocks of a first type and a second type such that when n>2, the first type and the second type of n pipeline blocks alternate.

10. The device of claim 9, wherein the first type of intermediate retimer block is associated with the first type of n pipeline blocks, and the second type of intermediate retimer block is associated with the second type of n pipeline blocks.

11. The device of claim 10, wherein the first type of intermediate timer block includes a positive edge-triggered flip-flop and buffer associated with the representative clock from one of an upstream group of channels and a main clock when the channel is associated with the first group of m channels, and a negative-edge triggered flip-flop and buffer associated with a representative clock from a downstream group of channels, and the second type of intermediate timer block includes a negative edge triggered flip-flop and buffer associated with a clock signal from an associated first type of intermediate timer block, and a positive edge-triggered flip-flop and buffer associated with a downstream group of channels.

12. The device of claim 11, wherein the positive edge-triggered flip-flop of the first type of intermediate timer block and the negative-edge triggered flip-flop of the first type of intermediate timer block has a propagation signal path between them of less than one half of a representative clock cycle, and the negative edge-triggered flip-flop of the second type of intermediate timer block and the positive-edge triggered flip-flop of the second intermediate timer block has a propagation signal path between them of less than one half of the clock cycle from the first intermediate timer.

13. The device of claim 10, wherein the first type of n pipeline blocks further comprises a number of negative edge triggered flip-flops connected in series to generate a delay, the number of negative edge triggered flip-flops are dependent on a total number of channel groups (n) and a position within the sequence of channel groups, the number of negative edge triggered flip-flops equals $2(n-i)-1$ when $i<n$ and 0 when $i=n$, an additional negative edge triggered flip-flop, and (m) parallel flip-flops which provide retiming to the separate divided clocks associated with the first type of n pipeline blocks, and wherein the second type of n pipeline blocks further comprises a number of positive edge triggered flip-flops connected in series to generate a delay, the number of positive edge triggered flip-flops dependent on the total number of channels (n) and a position within the sequence of the channel groups, the number of positive edge triggered flip-flops equals $2(n-i)$, an additional negative edge triggered flip-flop, and (m) parallel flip-flops which provide retiming to the separate divided clocks associated with the second type of n pipeline blocks.

14. The device of claim 13, wherein the positive edge-triggered flip-flop of the first intermediate timer block and the negative-edge triggered flip-flop of the first intermediate timer block are proximate to one another and has a propagation signal path between them of less than one half of the representative clock cycle.

15. The device of claim 1, wherein after a reset all of the separate divided clocks start pulsing with a phase difference of $+/-\frac{1}{4}$ cycle of the main divided clock.

16. A method for providing synchronized clocks in n groups of m channels, the method comprising the steps of:
   dividing a main clock to provide a main divided clock used as a write clock for FIFOs;
   propagating the main divided clock to groups of m channels; and
   matching pipeline delay in clock startup created by propagation to produce separate divided clocks for each of the m channels, the separate divided clocks are phase aligned with the main divided clock and substantially synchronized.

17. The method of claim 16, further comprising the step of controlling start times of the separate divided clocks in different clock domains so that a first cycle of each time domain is within a predetermined delay of one another.

18. The method of claim 16, further comprising the steps of:
   selecting one clock within the group of m channels as being representative of an entire group of m channels;
   using the selected clock by a retimer block in a propagation path immediately upstream or downstream of the groups of m channels in order to redivide the main divided clock; and providing separate divided clocks associated with each of the m channels so that the separate divided clocks start pulsing after a reset with a phase difference of $+/-\frac{1}{4}$ cycle of the main divided clock.

19. A method for providing synchronized clocks in different clock time domains physically arranged as n channel groups of m channels, the method comprising the steps of:

dividing a main clock to provide a main divided clock used as a write clock for FIFOs;

propagating the main divided clock to n channel groups of m channels;

matching pipeline delay in clock startup created by propagation through retimer blocks to produce separate divided clocks for each of the m channels, wherein the separate divided clocks are phase aligned with the main divided clock and substantially synchronized; and controlling start times of the separate divided clocks in different clock time domains so that a first cycle of each clock time domain is within a predetermined delay of one another.

20. The method of claim 19, wherein the matching pipeline delay step generates delays dependent on the total number of n channel groups and the position of an n channel group within a sequence of channel groups (i in the range of 1, to n).

* * * * *